United States Patent [19]
Ueki et al.

[11] Patent Number: 5,335,553
[45] Date of Patent: Aug. 9, 1994

[54] FLUIDIC GAS METER PROVIDED WITH A PRINTED WIRING BOARD

[75] Inventors: Takashi Ueki; Katsuhito Sakai, both of Tokyo; Koichi Kanda, Kuwana; Hideo Kamiya, Okazaki, all of Japan

[73] Assignees: Tokyo Gas Co. Ltd., Tokyo; Aichi Tokei Denki Co., Ltd., Nagoya, both of Japan

[21] Appl. No.: 791,249

[22] Filed: Nov. 13, 1991

[30] Foreign Application Priority Data

Nov. 15, 1990 [JP] Japan .............................. 2-120199[U]
Nov. 15, 1990 [JP] Japan .............................. 2-310701
Nov. 15, 1990 [JP] Japan .............................. 2-310702
Nov. 30, 1990 [JP] Japan .............................. 2-129632[U]

[51] Int. Cl.$^5$ .............................................. G01F 1/32
[52] U.S. Cl. .................................. 73/861.19; 29/837; 439/76
[58] Field of Search ............... 73/861.19; 361/412, 361/382; 439/76, 55, 540; 29/837

[56] References Cited

U.S. PATENT DOCUMENTS

| | | | |
|---|---|---|---|
| 4,550,614 | 11/1985 | Herzl | 73/861.19 |
| 4,610,084 | 9/1986 | Anderson et al. | |
| 4,674,182 | 6/1987 | Igarashi | 29/837 |
| 4,886,227 | 12/1989 | Matl | 439/76 |
| 4,932,873 | 6/1990 | La Shier | 439/76 |
| 5,157,974 | 11/1992 | Hattori et al. | 73/861.19 |

FOREIGN PATENT DOCUMENTS

2168767 6/1990 Japan .
2192492 of 0000 United Kingdom .

Primary Examiner—Stephen Chin
Assistant Examiner—Timothy J. May
Attorney, Agent, or Firm—Pollock, Vande Sande & Priddy

[57] ABSTRACT

A fluidic gas meter including a flow path structure provided with a fluidic element, a cut-off valve, a pressure switch, a flow sensor, a piezoelectric film sensor, an electronic circuit unit, and a wiring board serving as a mother board and having a function of lead wires. Each of the cut-off valve, the pressure switch, the flow sensor and the piezoelectric film sensor are fixed to the flow path structure. The electronic circuit unit is made up of a counter board and a control circuit board. The counter board is mounted with an electronic circuit for counting up flow-rate signals from the flow sensor and the piezoelectric film sensor and a liquid crystal display device for displaying the amount of gas consumed. The control circuit board is mounted with a control circuit for controlling the cut-off valve, wherein each of the cut-off valve, the pressure switch, the flow sensor, the piezoelectric film sensor and the electronic circuit unit is provided with a plurality of terminals extending perpendicularly to the wiring board. The wiring board is provided with a printed circuit for the interconnection among the terminals. The wiring board has a plurality of V-shaped guide grooves formed therein for receiving the terminals and guiding the terminals to through holes formed at an apex of the V-shape of the guide grooves, wherein the terminals form an electrical connection with the printed circuit of the circuit board, thereby avoiding wiring errors.

11 Claims, 16 Drawing Sheets

FIG. I
PRIOR ART
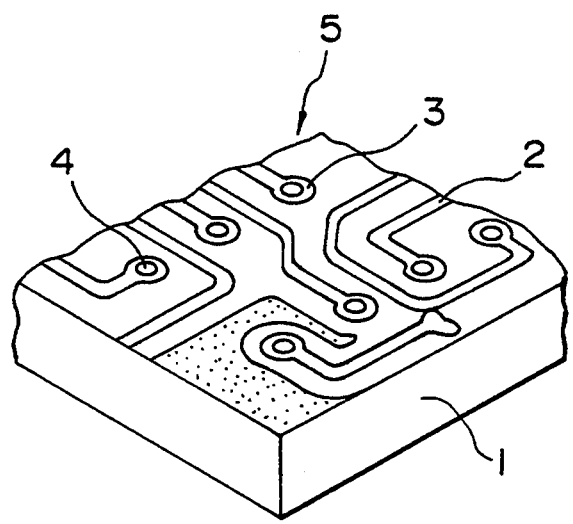
FIG. 2
PRIOR ART
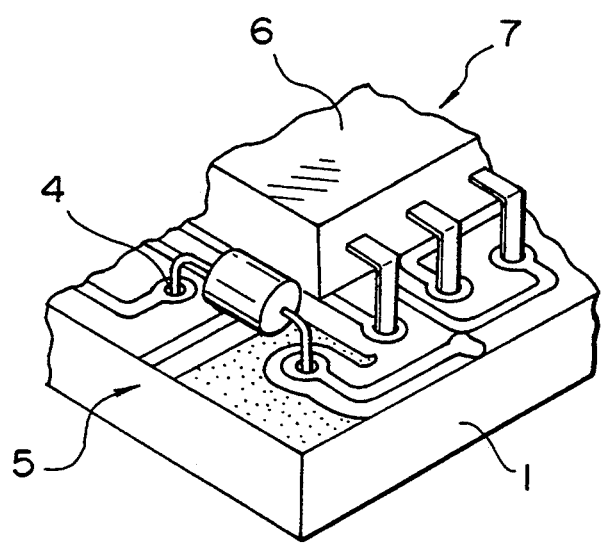

FLUIDIC GAS METER PROVIDED WITH A PRINTED WIRING BOARD

BACKGROUND OF THE INVENTION

The present invention relates to a printed wiring board and also a printed circuit board and an electronic apparatus which utilize the printed wiring board, and more particularly to a fluidic gas meter.

In a conventional printed wiring board for use in electronic apparatuses, as shown in FIG. 1, a conductor pattern 2 made of a conductive material is formed on a main surface of an insulating substrate 1, and a through hole 4 for an electronic part penetrates the insulating substrate 1 at a land 3. In FIG. 1, reference numeral 5 designates the printed wiring board.

As shown in FIG. 2, an electronic part 6 and an electronic device are mounted on the printed wiring board 5 at predetermined positions. Lead wires or terminals of the electronic part and others are inserted into the through holes 4 and then bonded to the lands 3 by solder to form a printed circuit board 7.

The printed circuit board 7, which is obtained by mounting the above-mentioned manner, has been used in electronic apparatuses.

In the conventional printed circuit board, however, there arise the following problems. That is, when the number of terminals of the electronic part and device mounted on the printed wiring board is increased, it is required to determine the positions of the through holes 4 accurately, and moreover it is difficult to insert the terminals of the electronic part and device into the through holes 4. Specifically, in a case where the electronic part and device are previously mounted mechanically on the frame or the like of an electronic apparatus and the terminals of the electronic part and device thus fixed are inserted into the through holes of the printed wiring board, the insertion of the terminals into the through holes is very difficult.

Next, let us consider a conventional fluidic gas meter. In the fluidic gas meter, a gas flows through a flow path structure including the so-called fluidic element which is designated by reference numeral 101 in FIG. 3, and fluidic oscillation of the gas flowing through the fluidic element is counted up to display the amount of gas consumed, because the frequency of the fluidic oscillation is proportional to the flow rate of the gas. In a case where the flow rate of the gas is extremely small, however, no fluidic oscillation is generated in the fluidic element. In this case, the flow rate of the gas is measured by a flow sensor. The amount of gas consumed due to the flow-rate measurement using the flow sensor is added to the amount of gas consumed due to the measurement using the fluidic element at an ordinary flow rate.

Referring to FIG. 3, a gas flows into the fluidic element 101 in a direction indicated by an arrow A, and the fluidic oscillation generated in the fluidic element is converted by a piezoelectric-film sensor 102 into an electric signal. In more detail, pulsating pressures at two feed-back flow paths of the fluidic element 101 are differentially applied to both surfaces of the piezoelectric film of the sensor 102, to obtain an electric signal having the same frequency as the frequency of the fluidic oscillation. A flow sensor 103 is made up of a heater to be disposed in a flow path and a pair of temperature sensors disposed on the upstream and downstream sides of the heater. The flow sensor 103 is disposed in a nozzle portion of the fluidic element 101 and determines a flow rate from the temperature difference between the temperature sensors due to the flow of a gas. The electric signal from the piezo-electric-film sensor 102 is amplified and shaped by an electronic circuit 104. On the other hand, the output signal of the flow sensor 103 is converted by an IC 105, supplementary thereto, into a pulse signal having a frequency proportional to the flow rate of the gas. A microcomputer 106 is applied with the outputs of the circuits 104 and 105, to calculate the amount of gas consumed, and a numeral indicating the amount of gas consumed is displayed by a display device 107. The fluidic gas meter does not only measure and display the amount of gas consumed, but also has a safety function of detecting abnormality in gas flow rate and gas pressure, detecting an earthquake, and cutting off a gas in case of emergency. In order to perform the safety function, the gas meter is provided with a pressure switch, a seismic sensor, a cut-off valve (that is, electromagnetic valve), an electronic circuit including a microcomputer, and a battery. Further, the electronic devices and units are connected to one another by lead wires.

In order to put the fluidic gas meter to practical use, it is necessary to mount the cut-off valve (that is, electromagnetic valve), the pressure switch, the flow sensor, the piezoelectric-film sensor, the seismic sensor and the electronic circuit on the flow path structure including the fluidic element, as one body, and to make the assembly thus obtained as small as possible. The number of lead wires from the cut-off valve, the pressure switch, the flow sensor, the piezoelectric-film sensor and the electronic circuit is very large. Accordingly, a space for the lead wires is insufficient and the lead wires are forced in a gap between devices such as the pressure switch and the cut-off valve. Thus, there arise problems that a device is damaged on the basis of the physical interference between the device and lead wires, and electric interference occurs between a device and lead wires.

Further, the conventional fluidic gas meter is provided with an electronic circuit unit made up of a liquid crystal display portion and a circuit portion. In the electronic circuit unit, as shown in FIG. 4, a liquid crystal display portion 201 and a circuit portion 208 which is provided with IC's 202 and 203, resistors 204 to 206 and a capacitor 207, are formed on a circuit board 209 as one body. Alternatively, as shown in FIG. 5, a board 210 mounted with the liquid crystal display portion 201 is electrically connected to another board 211 mounted with the circuit portion 208, by lead wires 212 or a flat cable. In a case where the electronic circuit unit of FIG. 4 is mounted on an electronic gas meter, there arises a problem that the orientation of the liquid display portion is restricted. On the other hand, in a case where the electronic circuit unit of FIG. 5 is used, there arises a problem that the number of steps for connecting the boards 210 and 211 electrically is increased.

Further, in a case where a cord is connected with an electric meter such as an electronic gas meter, each of lead wire included in the cord is connected electrically with a corresponding one of terminals of the electronic meter by a screw or solder, or each lead wire is pressed into electrical contact with a corresponding one of the terminals. As can be seen from the above, in the conventional connecting method, the electrical connection of one lead wire with one terminal is repeated a plurality of times. Thus, there arise problems that the connection of one of the lead wires with a corresponding terminal may be forgotten, and it takes a lot of time to connect the lead wires with the terminals.

SUMMARY OF THE INVENTION

It is a main object (that is, the first object) of the present invention to provide a printed wiring board which can solve the above-mentioned problems of the prior art, and to provide a printed circuit board and an electronic apparatus which utilize the above printed wiring board.

It is another object (that is, the second object) of the present invention to provide a fluidic gas meter which can solve the above-mentioned problems of the conventional gas meter.

It is a further object (that is, the third object) of the present invention to provide an electronic circuit unit which can solve the above-mentioned problems of the conventional circuit unit.

It is still another object (that is, the fourth object) of the present invention to provide a connecting structure for connecting lead wires of a cord to an electronic meter which structure can solve the above-mentioned problems of the prior art.

In order to attain the first object, according to an aspect of the present invention, there is provided a printed wiring board having a conductor pattern 2 and a land 3 each formed on one surface of an insulating substrate 1 and made of a conductive material, in which, as shown in FIG. 6, a through hole 9 for an electronic part is formed at the land 3, a V-shaped guide groove 10 penetrating the substrate is formed so as to communicate with the through hole 9, and an aperture 11 is formed in the substrate at the enlarged end of the guide groove 10.

In a case where a plurality of through holes 9 are formed and each of V-shaped guide grooves 10 communicates with a corresponding one of the through holes 9, it is preferable that the V-shaped grooves are equal in orientation to each other.

Referring to FIG. 6, it is preferable to connect a printed wiring board 8 with a desired body in such a manner that terminals 13a, 14a, 15a, 16a and 17a of electronic parts and devices 13, 14, 15, 16 and 17 are inserted into apertures 11 of the printed wiring board 8, the electronic parts and devices 13 to 17 are moved for the printed wiring board 8 so that the terminals 13a to 17a enter the through holes 9, and then the terminals are bonded to lands 3 by solder.

Even in a case where the electronic parts and devices 13 to 17 have been mechanically mounted on a frame (for example, flow-path structure 25) of an electronic apparatus, the terminals 13a to 17a can be bonded to the lands 3 of the printed wiring board 8 by solder in the above-mentioned manner.

As mentioned above, when the terminals of the electronic parts and devices are inserted into the through holes of the printed wiring board to mount the electronic parts and devices on the board, the terminals are first inserted into the large apertures, and then the board is moved for the electronic parts and devices so that the terminals are guided by the V-shaped grooves to the through holes. Accordingly, the terminals are accurately located in the through holes, and are surely bonded to the lands by solder.

In order to attain the second object, according to another aspect of the present invention, there is provided a fluidic gas meter including a flow path structure 25 provided with a fluidic element, a cut-off valve 15, a pressure switch 16, a flow sensor 14, a piezoelectric-film sensor 13, an electric circuit unit 17, and a wiring board, 124 serving as a mother board. Each of the cut-off valve, the pressure switch, the flow sensor and the piezoelectric-film sensor are fixed to the flow path structure. The electronic circuit unit is made up of a counter board 19 and a control circuit board 20. The counter board being mounted with not only an electronic circuit for counting up flow-rate signals from the flow sensor and the piezoelectric-film sensor but also a liquid crystal display device 18 for displaying the amount of gas consumed. The control circuit board is mounted with a control circuit for controlling the cut-off valve, in which meter as shown in FIG. 14. Each of the cut-off valve 15, the pressure switch 16, the flow sensor 14, the piezoelectric-film sensor 13 and the electronic circuit unit 17 is provided with a plurality of terminals 15a, 16a, 14a, 13a, or 17a extending perpendicularly to the wiring board 124. The wiring board is provided with a printed circuit 125 for the interconnection among the terminals, and the terminals 15a, 16a, 14a, 13a and 17a are electrically connected with the wiring board 124.

It is preferable to dispose a plurality of terminals 15a, 16a, 14a, 13a, or 17a of each of the cut-off valve 15, the pressure switch 16, the flow sensor 14, the piezoelectric-film sensor 13 and the electronic circuit unit 17 on a horizontal or vertical plane so as to be parallel to each other, as shown in FIG. 14.

Further, it is preferable to dispose the electronic circuit unit 17 at the top of the flow path structure 25 and to dispose the flow sensor 14 and the piezoelectric-film sensor 13 on the outlet side of the flow path structure 25 in series.

Furthermore, it is preferable to provide a guide hole 126 for positioning in a central portion of the wiring board 124 and to form a guide shaft 35 on the flow path structure so that the guide shaft is fitted into the guide hole.

Additionally, the wiring board 124 may be provided with an external terminal 12 for sending out an electric signal to the outside.

In the above gas meter, the terminals 15a, 16a, 14a, 13a and 17a of the cut-off valve 15, the pressure switch 16, the flow sensor 14, the piezoelectric-film sensor 13 and the electronic circuit unit 17 are electrically connected to one another through the printed circuit 125 of the wiring board 124, and the wiring board 124 acts as a mother board.

The guide shaft 35 of the flow path structure 117 is fitted into the guide hole 126 of the wiring board 124 to accurately locate the wiring board 124 in relation to a gas meter proper.

Preferably, the terminals 15a, 16a, 14a, 13a and 17a are made different from one another in the length of that portion of a terminal which is inserted in a corresponding through hole of the wiring board 124, because the terminals can be inserted into through holes of the wiring board 124 in the order of the above length, and thus it becomes easy to mount the wiring board 124 on the gas meter proper.

In order to attain the third object, according to a further aspect of the present invention, there is provided an electronic circuit unit, in which as shown in FIG. 18, a single printed board 220 is divided into a first main part 220c, a second main part 220d and a boundary part 220b sandwiched between the first and second main parts. A plurality of apertures 224 to 227 are formed in the boundary part along a direction traversing the printed board 220 so that one of small connecting portions 221 to 223 is left between adjacent apertures. A liquid crystal display portion 228 is mounted on the first main part 220c. A circuit portion is mounted on the second main part 220d. The liquid crystal display portion 228 and the circuit portion are electrically connected to each other through a connecting member such as a flat cable 232 or flexible printed board, and then the connecting portions 221 to 223 are bent to separate the first and second main parts 220c and 220d from each other.

In the above electronic circuit unit, the liquid crystal display portion 228 and the circuit portion are mounted on the first and second main parts 220c and 220d, respectively, and the flat cable 232 or flexible printed board is connected between the first and second main parts 220c and 220d. Accordingly, it is easy to mount electronic parts on the circuit unit. Thereafter, the connecting portions 221 to 223 are bent to separate the printed board 220 into the first and second main parts 220c and 220d. Thus, the liquid crystal display portion 228 can be oriented in a desired direction, independently of the circuit portion. Further, the apertures formed at facing edges of the board 220, that is, notches 224 and 227 prevent the facing edges from being damaged, when the first and second main parts 220c and 220d are separated from each other. Moreover, the notches 224 and 227 make easy the separation of the board 220 into two parts.

In order to attain the fourth object, according to still another aspect of the present invention, there is provided a connecting structure for connecting lead wires of a cord to an electronic meter, in which, as shown in FIGS. 23A and 23B, an electronic meter proper 301 is provided with a plurality of terminals 302 and 303 arranged along a straight line at an interval A. A notch 304 made up of a V-shaped aperture and a narrow aperture extended from the bottom of the V-shaped aperture and having a width w is formed in each of the terminals so that the V-shaped aperture is formed at the top of each terminal and the narrow apertures of the terminals are parallel to each other. A holding member 308 is provided with a pair of parallel protrusions 308b and 308c. Each of the protrusions has a plurality of notches formed at the interval A, to be used as a grasping portion. Each of a plurality of lead wires 306 and 307 of a cord is held by a pair of notches of the protrusions 308b and 380c in a stretched state, and the holding member 308 is mounted on the electronic meter proper 301 in such a manner that those portions of the lead wires 306 and 307 which are stretched by the protrusions 308b and 308c, confront the notches 304 of the terminals 302 and 303.

When the holding member 308 is brought near to the electronic meter proper 301 by a screw mechanism 311 in a state that the stretched portions of the lead wires 306 and 307 confront the notches 304 of the terminals 302 and 303, the lead wires 306 and 307 are forced in the narrow apertures of the notches 304 through the V-shaped apertures. Thus, the insulating layers of the lead wires 306 and 307 are broken by the terminals 302 and 303, respectively, and the conductor portions of the lead wires 306 and 307 are forced in the narrow apertures of the notches 304 and pressed in close contact with the terminals 302 and 303.

BRIEF DESCRIPTION OF THE DRAWINGS

FIG. 1 is a perspective view showing a part of a conventional printed wiring board.

FIG. 2 is a perspective view showing a part of a conventional printed circuit board.

DESCRIPTION OF THE PREFERRED EMBODIMENTS

Figure 3:
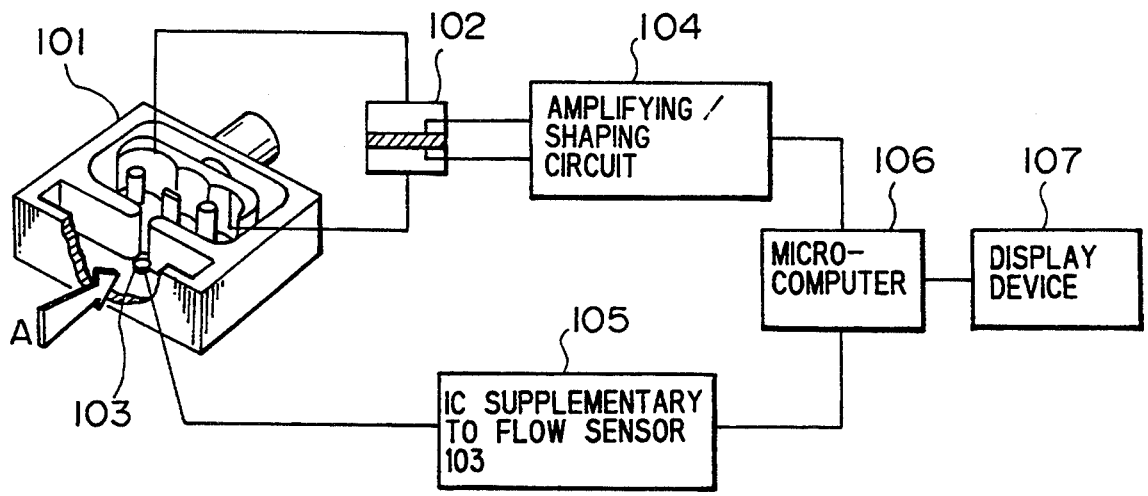
FIG. 3 is a diagram for explaining the fundamental principle of a conventional fluidic gas meter.
Figure 4:
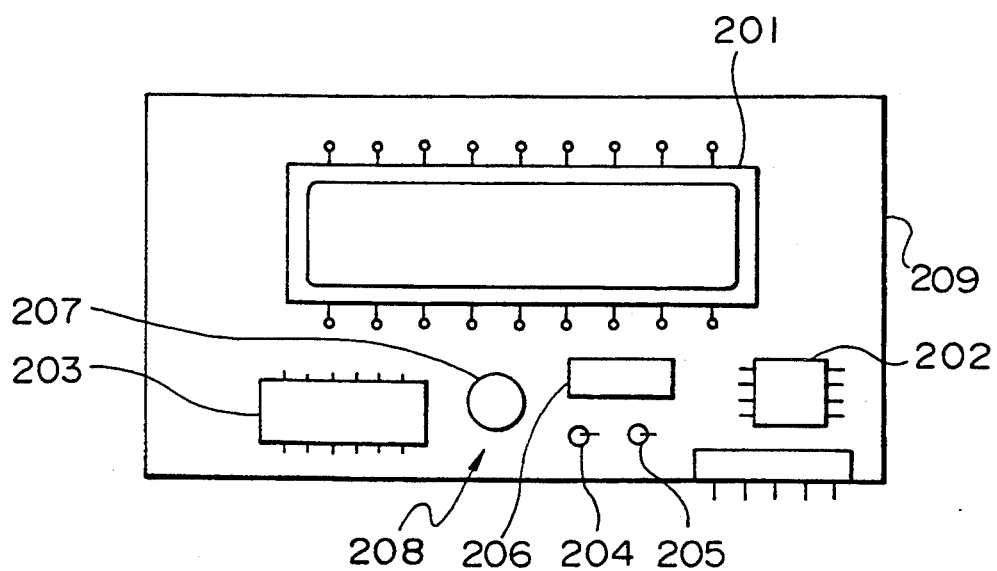
FIG. 4 is a plan view showing a conventional electronic circuit unit provided with a liquid crystal display portion.
Figure 5:
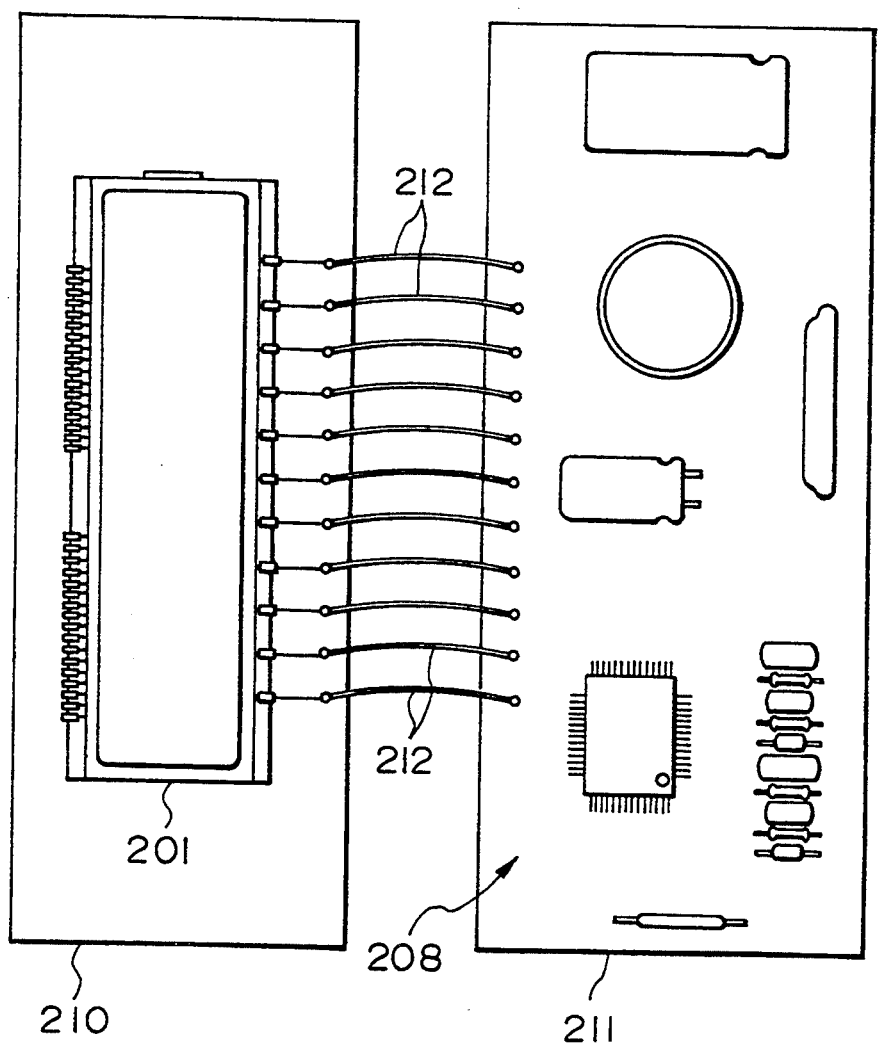
FIG. 5 is a plan view showing another conventional electronic circuit unit provided with a liquid crystal display portion.

FIGS. 6 to 13 are diagrams for explaining an embodiment of an electronic gas meter according to the present invention. In the embodiment, fluidic oscillation which has a frequency corresponding to the flow rate of a gas, is generated in a flow path structure, and the frequency is converted into an electric signal, which is counted up to detect the amount of gas consumed. In a case where the flow rate is extremely small, the fluidic oscillation is scarcely generated, and hence a flow sensor utilizing the principle of a hot-wire flowmeter is used for detecting the flow rate. The detected flow rate is converted into an electric signal, which is counted up for detecting the amount of gas consumed in a case where the flow rate is extremely small. Further, the embodiment is not only provided with a cut-off valve for cutting off a gas in a case where abnormality in gas pressure or gas flow rate, or an earthquake is generated, to perform a safety function, but also has a communication function for checking the amount of gas consumed by telephone. The above-mentioned structure of an electronic gas meter is well known.

Referring now to FIGS. 6 to 11, a printed wiring board 8 has a conductor pattern 2 and a land 3 which are formed on a main surface of an insulating substrate 1 and made of a conductive material, a through hole 9 penetrating the insulating substrate 1 at the land 3, a guide grove 10 penetrating the insulating substrate 1 and extending downwardly from the through hole 9 in the form of a character V, and an aperture 11 contiguous to the enlarged end of the V-shaped guide groove 10. Further, the printed wiring board 8 is provided with an external terminal 12, and a signal for the automatic inspection of the gas meter is sent out from the external terminal 12 to the outside. The external terminal 12 is provided with four pins 12a connected with the conductor pattern 2. A piezoelectric-film sensor 13 detects the fluidic oscillation and converts the fluidic oscillation into an electric signal. The sensor 13 has five terminals 13a which protrude backwardly from the case of the sensor 13 so as to be perpendicular to the printed wiring board and to be juxtaposed on the same horizontal plane. A flow sensor 14 detects an extremely small flow rate, and converts the detected flow rate into an electric signal. The sensor 14 has four terminals 14a protruding backwardly from the case of the sensor 14. Similarly to the terminals 13a of the piezoelectric-film sensor 13, the terminals 14a of the flow sensor 14 are perpendicular to the printed wiring board 8, and are juxtaposed on the same horizontal plane. A cut-off valve (that is, electromagnetic valve) 15 has two terminals 15a protruding backwardly, and the terminals 15a are disposed on the same vertical plane. A pressure switch 16 for detecting the abnormality in gas pressure has two terminals 16a protruding backwardly from the case of the switch 16, and the terminals 16a are disposed on the same horizontal plane. A counter board 19 is mounted with an electronic circuit for counting up a flow-rate signal from each of the piezoelectric-film sensor 13 and the flow sensor 14 and for displaying the counted value on the liquid crystal display device 18. A control circuit board 20 is mounted with a control circuit for controlling the opening and closing of the cut-off valve 15. An electronic circuit unit 17 is made by fixing the counter board 19 and the control circuit board 20 to a frame 21 made of plastics, as one body. Although, in FIG. 6, the liquid crystal display device 18 is not mounted on the counter board 19, the device 18 is actually bonded to the counter board 19 by solder. The electronic circuit unit 17 has six terminals 17a protruding backwardly. Similar to the terminals of each of the devices 13, 14 and 16, the terminals 17a are disposed on the same horizontal plane. Batteries 22 and 23 are mounted on the control circuit board 20, and a seismic sensor 24 mounted on the control circuit board 20 detects an earthquake having a seismic intensity greater than a predetermined value. Upon detecting the earthquake, the seismic sensor 24 sends an electric signal to the control circuit. A flow path structure 25 for passing a gas is made by the die casting of aluminum, and each of an inlet member 26 and an outlet member 27 is formed on the bottom of the flow path structure 25, as one body. The piezoelectric-film sensor 13 and the flow sensor 14 are fixed to the rear face of the flow path structure 25 by screws 28 and 29, respectively. The cut-off valve 15 is fixed to the right face of the flow path structure 25 by a screw 30, and the pressure switch 16 is attached to the top of the flow path structure 25. Further, the electronic circuit unit 17 is fixed to the top of the flow path structure 25 by a screw 31. As mentioned above, the flow path structure 25 serves as a frame, to which the electronic circuit unit 17 and various devices such as the piezoelectric-film sensor 13, the flow-sensor 14, the cut-off valve 15 and the pressure switch 16 are mechanically fixed.

Figure 6:
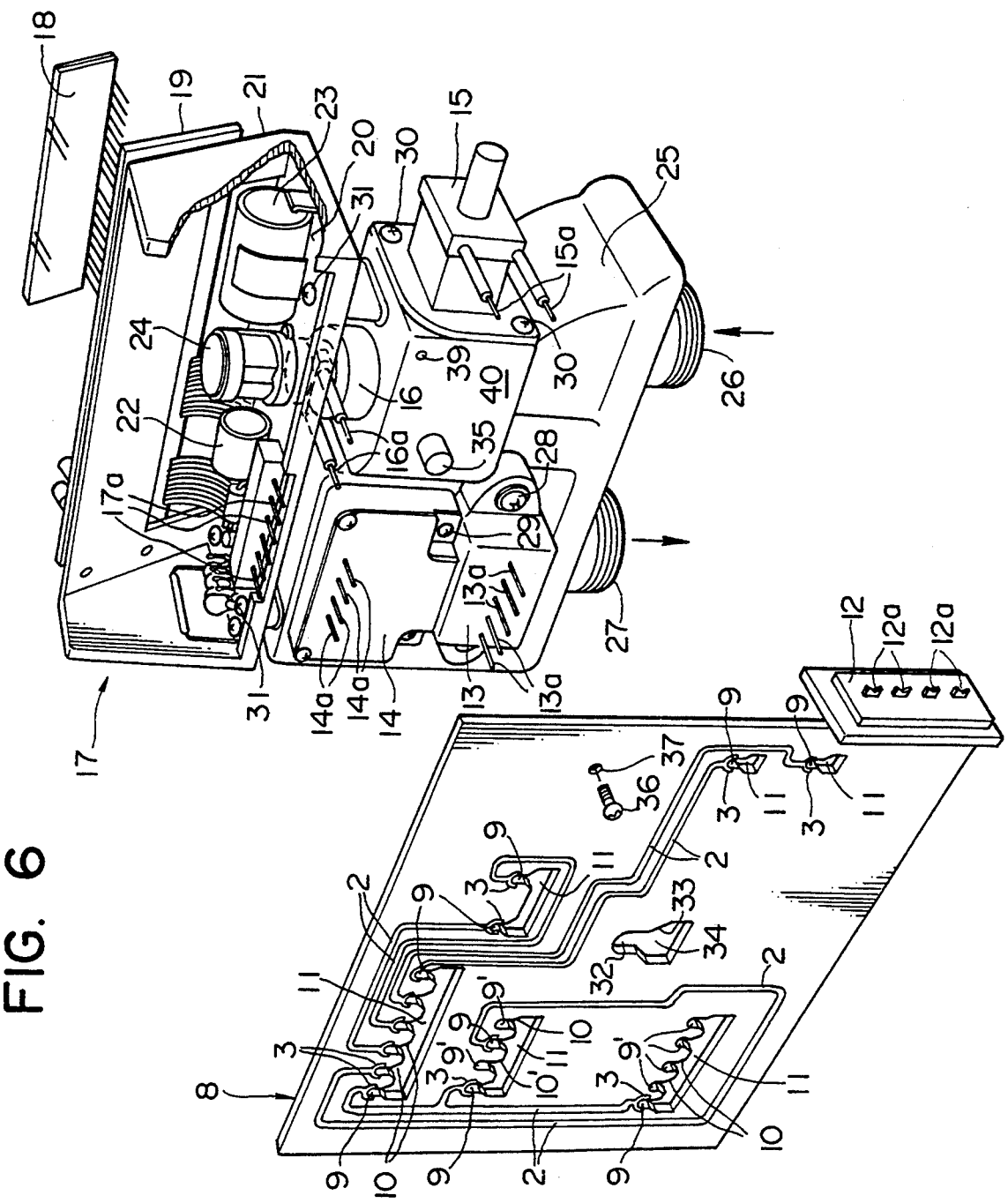
FIG. 6 is a perspective view showing an embodiment of an inventive combination of a printed wiring board and a fluidic gas meter proper.
Figure 7A:
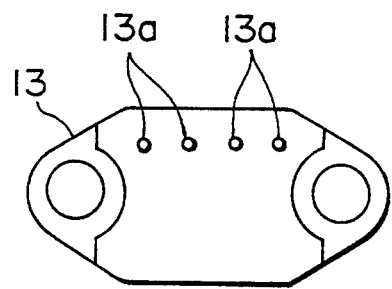
FIGS. 7A and 7B are plan and side views which show a sensor included in the embodiment of FIG. 6.
Figure 7B:
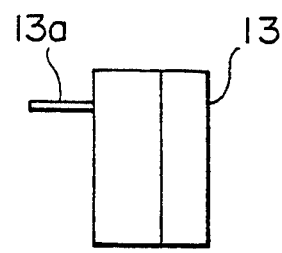
Figure 8A:
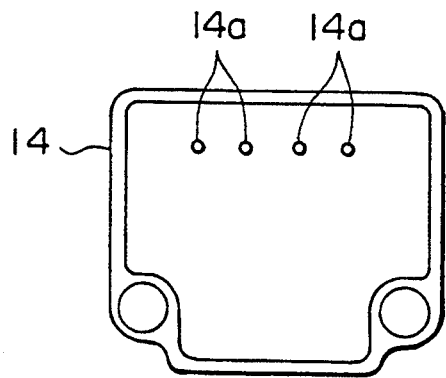
FIGS. 8A and 8B are plan and side views which show another sensor included in the embodiment of FIG. 6.
Figure 8B:
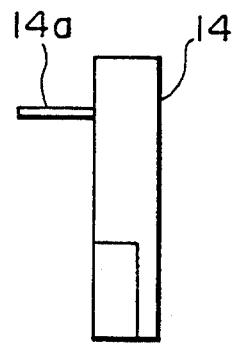
Figure 9:
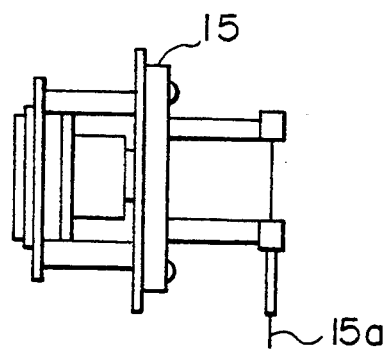
FIG. 9 is a side view which shows a cut-off valve included in the embodiment of FIG. 6.
Figure 10:
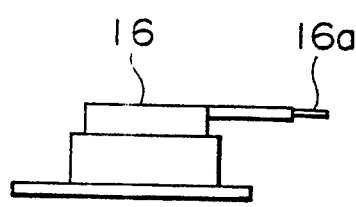
FIG. 10 is a side view which shows a pressure switch included in the embodiment of FIG. 6.
Figure 11:
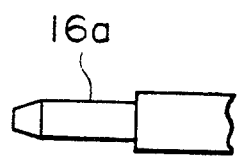
FIG. 11 is a side view showing a terminal of the pressure switch of FIG. 10.

As shown in FIG. 6, the printed wiring board 8 is brought near to the rear side of each of the electronic circuit unit and the devices mounted on the flow path structure 25, while keeping a vertical state. When the terminals of the electronic circuit unit and the terminals of each device are inserted into corresponding apertures 11 of the printed wiring board 8, the printed wiring board 8 is moved downward. Thus, each terminal is led to a corresponding V-shaped groove 10, and then fitted into a corresponding through hole 9. The through hole 9 is contiguous to the V-shaped groove 10. Accordingly, the through hole 9 is not an independent circular hole, but is a narrow groove extending from the bottom of the V-shaped groove 10. The above narrow groove, however, is herein called "through hole" in accordance with idromatic expression. A guide hole 32 is provided in a central portion of the printed wiring board 8. Like the through hole 9, the guide hole 32 is provided with a V-shaped groove 33 and an aperture 34. A guide shaft 35 protruding from the flow path structure 25 is fitted into the guide hole 32, to locate the printed wiring board 8 accurately, thereby making easy the assembling of the present embodiment. The printed wiring board 8 is fixed to the flow path structure 25 by a screw 36. As mentioned above, the guide shaft 35 is fitted into the guide hole 32 of the printed wiring board 8, each terminal is fitted into a corresponding through hole 9 of the printed wiring board 8, and the screw 36 penetrates a hole 37 of the printed wiring board and is then threaded inside of a female screw 39 formed in the flow path structure 25. Thus, the printed wiring board 8 is fixedly pressed against a predetermined surface 40 of the flow path structure 25. Thereafter, each terminal is bonded to a corresponding land 3 of the printed wiring board 8 by solder.

Figure 12:
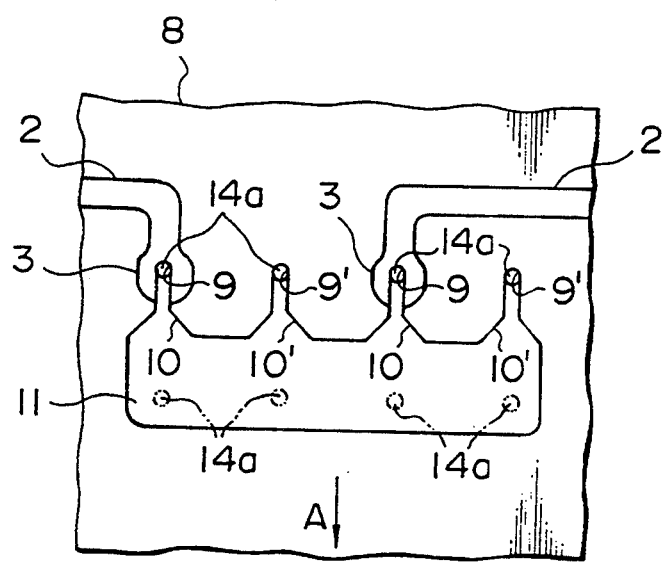
FIG. 12 is a rear view which shows the printed wiring board used in the embodiment of FIG. 6.

FIG. 12 is a diagram for explaining an assembling process, in which the terminals 14a of the flow sensor 14 are first inserted into an aperture 11 of the printed wiring board 8, and then the board 8 is moved in a direction A, to fit the terminals 14a into through holes 9. It is to be noted that a through hole 9' is distinguished from a through hole 9, since the through hole 9' is not provided with a land 3 though a terminal 14a is fitted into the through hole 9'. Like the through hole 9', a V-shaped groove 10' is distinguished from a V-shaped groove 10.

Figure 13:
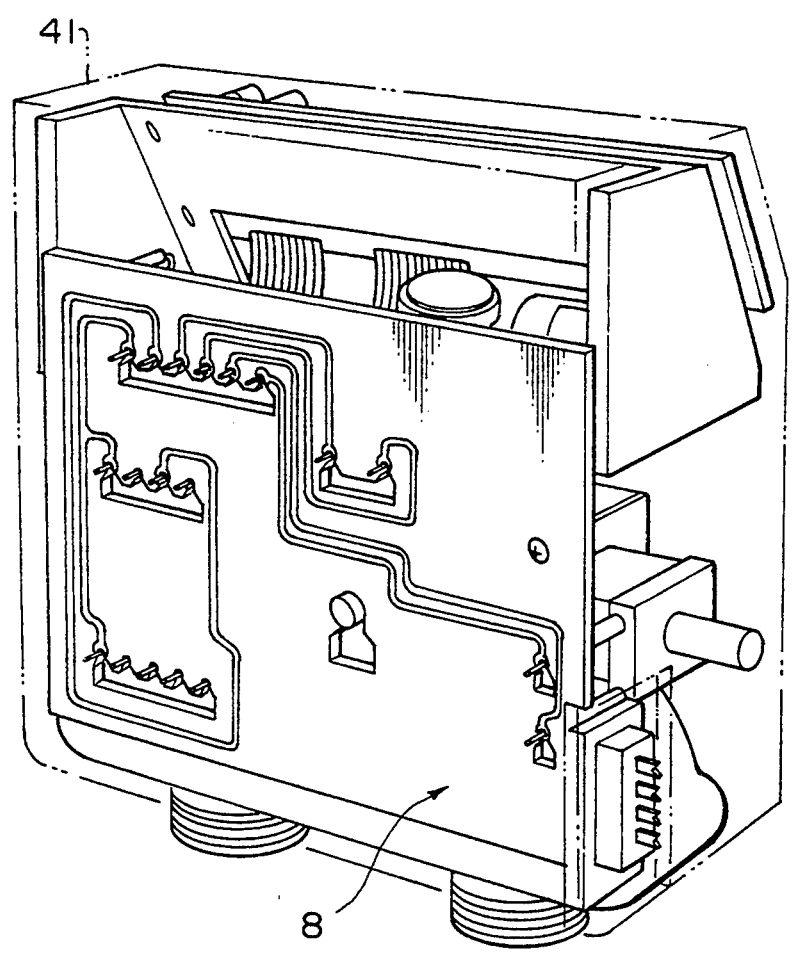
FIG. 13 is a rear view showing the embodiment of FIG. 6 in a state that the printed wiring board is mounted on the fluidic gas meter proper, and terminals thereof are fitted in through holes of the printed wiring board.

FIG. 13 shows the present embodiment at a time when the lands 3 on the printed wiring board 8 have been bonded to corresponding terminals by solder, that is, the finished present embodiment. Incidentally, a gas meter case 41 is indicated by two-dot dask lines in FIG. 13.

The printed wiring board used in the present embodiment has the above-mentioned structure. Accordingly, even when the pitch of terminals and the pitch of through holes provided in the printed wiring board are inferior in accuracy to those in prior art, the printed wiring board can be readily mounted on the gas meter proper. Accordingly, it is not required to determine the above pitches very accurately, and moreover the assembling of the gas meter becomes easy.

Specifically, in a case where, after a large number of devices have been mounted on the frame of an electronic apparatus proper, terminals of the devices are bonded to a printed wiring board by solder, it is difficult to locate each terminal accurately in relation to the printed wiring board. Even in this case, the printed wiring board of FIG. 6 makes easy the assembling of the electronic apparatus.

Next, another embodiment of a gas meter according to the present invention will be explained below, with reference to FIGS. 14 and 15.

Figure 14:
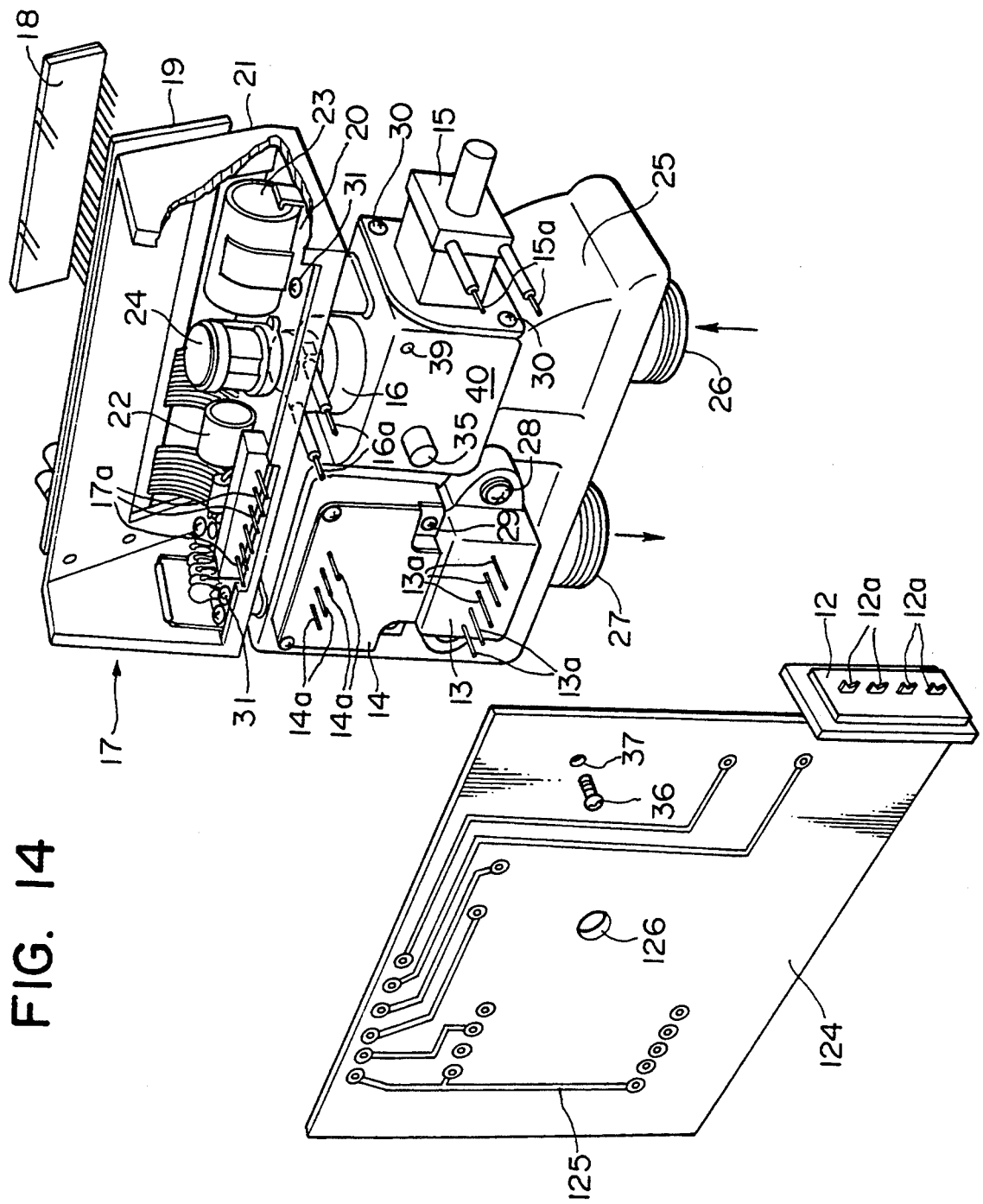
FIG. 14 is a perspective view showing another embodiment of an inventive combination of a printed wiring board and a fluidic gas meter proper.

Referring to FIG. 14, the pressure switch 16 operates at a time when the gas pressure in the vicinity of the inlet of the gas meter becomes an abnormal value lower than a first predetermined value or greater than a second predetermined value, and two terminals 16a protrude backwardly from the case of the pressure switch 16. The terminals 16a are disposed on the same horizontal plane. An electronic circuit for counting up a flow-rate signal from each of the piezoelectric-film sensor 13 and the flow sensor 14 and for displaying the counted value on the liquid crystal display device 18 is mounted on the counter board 19, and a control circuit for controlling the opening and closing of the cut-off valve 15 is mounted on the control circuit board 20. Each of the counter board 19 and the control circuit board 20 is bonded to the frame 21 made of plastics, as one body, to form the electronic circuit unit 17.

Although in FIG. 14, the liquid crystal display device 18 is separated from the counter board 19, the device 18 is actually bonded to the counter board 19 by solder. Six terminals 17a protrude backwardly from the electronic circuit unit 17. Like the terminals of each of the devices 13, 14 and 16, the terminals 17a are disposed on the same horizontal plane. The batteries 22 and 23 are mounted on the control circuit board 20. The seismic sensor 24 is also mounted on the control circuit board 20. When the seismic sensor 24 detects an earthquake wave, an electric signal is sent from the seismic sensor 24 to the control circuit. The flow path structure 25 including a fluidic element is made by the die casting of aluminum. Each of the inlet and outlet members 26 and 27 for a measured gas is attached to the bottom of the flow path structure 25, as one body. The piezoelectric-film sensor 13 and the flow sensor 14 are mounted on the outlet side of the flow path structure 25 so that the sensors 13 and 14 are disposed in series along a vertical direction, and are bonded to the rear face of the flow path structure 25 by the screws 28 and 29, respectively. The cut-off valve 15 is bonded to the right side face of the flow path structure 25 by the screw 30, and the pressure switch 16 is mounted on the top of the flow path structure 25. Further, the electronic circuit 17 is fixed to the top of the flow path structure 25 by the screw 31. A printed wiring board 124 has through holes, into which the terminals 13a, 14a, 15a, 16a and 17a are inserted, a printed land formed around each of the through holes, and a printed circuit 125 for connecting the lands appropriately. The printed wiring board 124 is brought near to the devices and electronic circuit unit mounted on the flow path structure, on the rear side thereof, while keeping a vertical state, the terminals of the devices and electronic circuit unit are inserted into corresponding through holes of the printed wiring board, and then the terminals are bonded to the lands by solder, to complete the wiring operation for the gas meter. A guide hole 126 is provided in a central portion of the printed wiring board 124. The guide shaft 35 protruding from the flow path structure 25 is fitted into the guide hole 126, to locate the printed wiring board 124 accurately in relation to the gas meter proper, thereby making easy the assembling the present embodiment. The printed wiring board 124 is fixed to the flow path structure 25 by the screw 36. As mentioned above, the guide shaft 35 is fitted into the guide hole 126 of the printed wiring board 124, and the screw 36 penetrates the through hole 37 of the printed wiring board 124 and is then threaded inside of the female screw 39 provided in the flow path structure 25. Thus, the printed wiring board 124 is fixedly pressed against the predetermined surface 40 of the flow path structure 25. The printed wiring board 124 is provided with the external terminal 12, and a signal for the automatic inspection of the gas meter is sent out from the external terminal 12 to the outside. The external terminal 12 is provided with four pins 12a which are electrically connected with the printed circuit 125 by solder.

Figure 15:
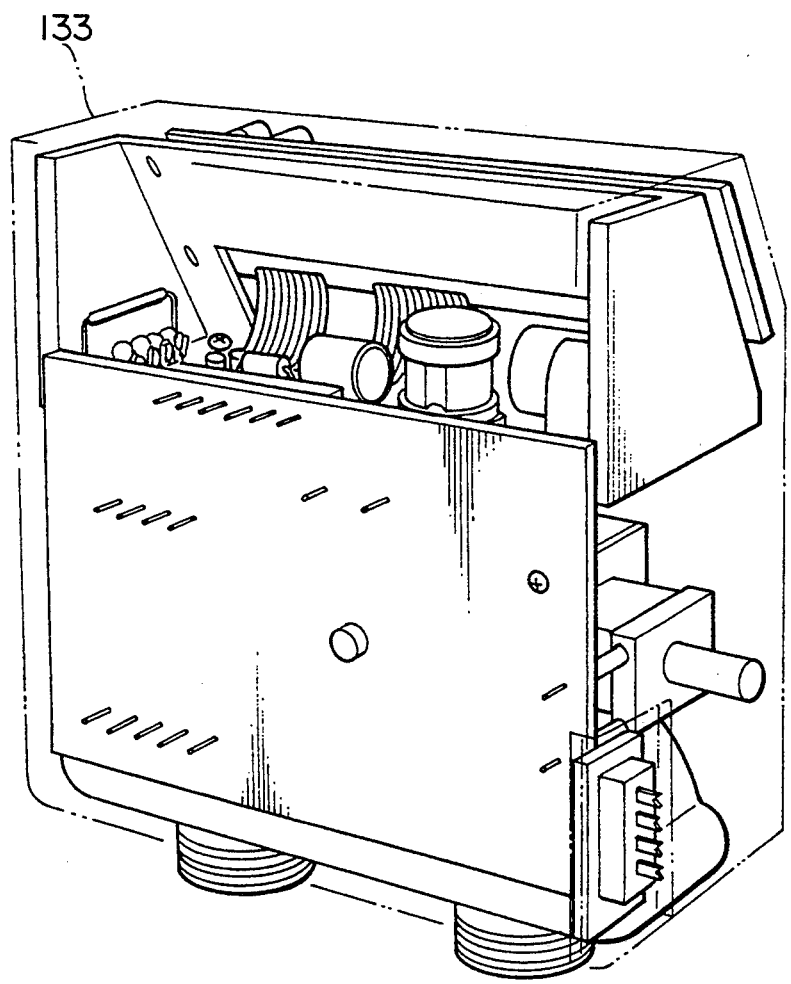
FIG. 15 is a rear view showing the embodiment of FIG. 14 in a state that the printed wiring board is mounted on the fluidic gas meter proper, and terminals thereof are fitted in through holes of the printed wiring board.

FIG. 15 shows the present embodiment at a time when the lands on the printed wiring board 124 have been bonded to corresponding terminals by solder, that is, the finished present embodiment. Incidentally, a gas meter case 133 is indicated by two-dot dash lines in FIG. 15.

Further, in the present embodiment, the terminals 15a, 16a, 14a and 13a of the devices 15, 16, 14 and 13 and the terminal 17a of the electronic circuit unit 17 are made different from one another in length (strictly speaking, in the length of portion of a terminal which is inserted in a corresponding through hole of the printed wiring board 124). For example, that portion of the terminal 17a of the electronic circuit unit 17 disposed at the uppermost portion of the present embodiment which is inserted in a corresponding through hole of the printed wiring board 124, is made longest, the length of that portion of the terminal of a device which is inserted in a corresponding through hole of the printed wiring board 124, decreases, as the position of the device is lower, and that portion of the terminal 13a of the piezoelectric-film sensor 13 disposed at the lowermost portion of the present embodiment which is inserted in a corresponding through hole of the printed wiring board 124, is made shortest. When the terminals 15a, 16a, 14a, 13a and 17a are made different in the insertion length from one another as mentioned above, these terminals can be readily fitted in through holes of the printed wiring board 124.

For a gas meter, it is necessary to make the airtight test of the flow path structure in the course of assembling. Accordingly, the airtight test of the flow path structure 25 is made in a state that the cut-off valve 15, the pressure switch 16, the flow sensor 15 and the piezoelectric-film sensor 13 are mounted on the flow path structure 25. When the flow path structure 25 passes the airtight test, the electric circuit unit 17 and the printed wiring board 124 are attached to the flow path structure 25.

Figure 16:
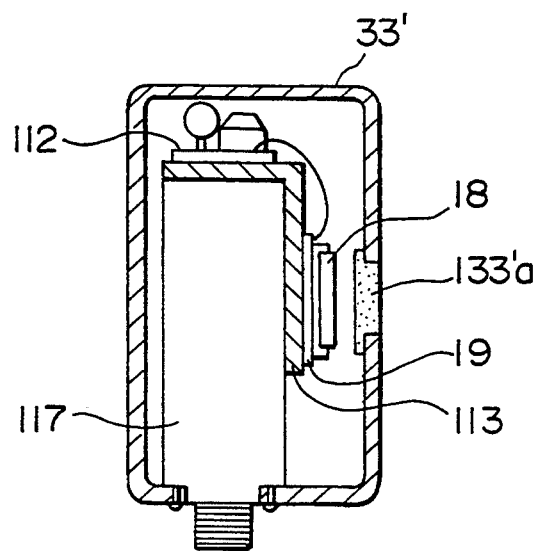
FIG. 16 is a sectional view showing a modified one of the arrangement of a liquid crystal display portion in the embodiment of FIG. 14.
Figure 17:
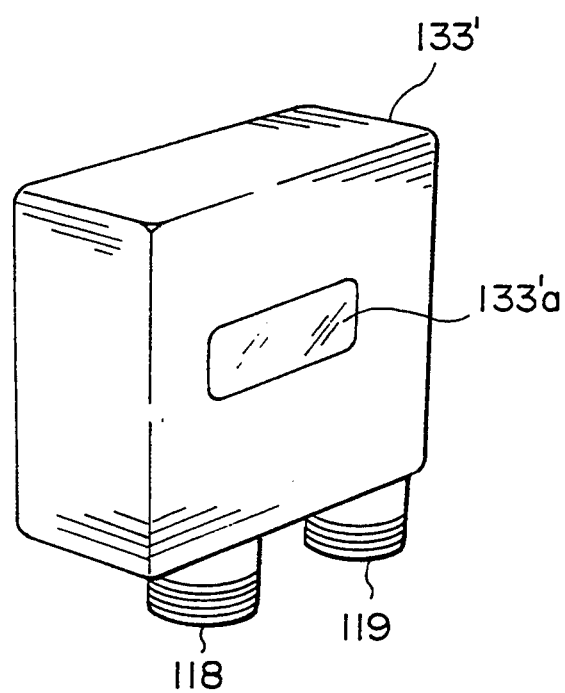
FIG. 17 is a sectional view showing the arrangement of the liquid crystal display portion in FIG. 16.

FIGS. 16 and 17 show a modified version of the embodiment of FIGS. 14 and 15. This modified version is different in position of the liquid crystal display device from the embodiment of FIGS. 14 and 15, and is suitable for use in a case where it is desired to dispose the liquid crystal display device 18 at a low position. In FIGS. 16 and 17, reference numeral 117 designates the flow path structure, 118 the gas inlet member, 119 the gas outlet member, 18 the liquid crystal display device disposed at the middle of the gas meter to be visually observed at the front thereof, 19 the counter board, 42 the control circuit board, 33 the frame made of plastics, and 133' a gas meter having, at the front thereof, window glass 133'a for reading out the amount of gas consumed which is displayed by the liquid crystal display device 18.

In the embodiment of FIGS. 14 and 15 and the modified version thereof, no lead wire is used for the wiring operation. Accordingly, a space for lead wires is not required, and hence the embodiment can be made small in size. Additionally, there is no fear of generating a wiring mistake, and the number of assembling steps for wiring is greatly reduced.

Further, the guide hole is provided in the printed wiring board, and the flow path structure is provided with the guide shaft. Accordingly, the printed wiring board can be accurately located in relation to the flow-path structure when the former is mounted on the latter. Thus, a multiplexity of terminals can be readily inserted into through holes of the printed wiring board.

Figure 18:
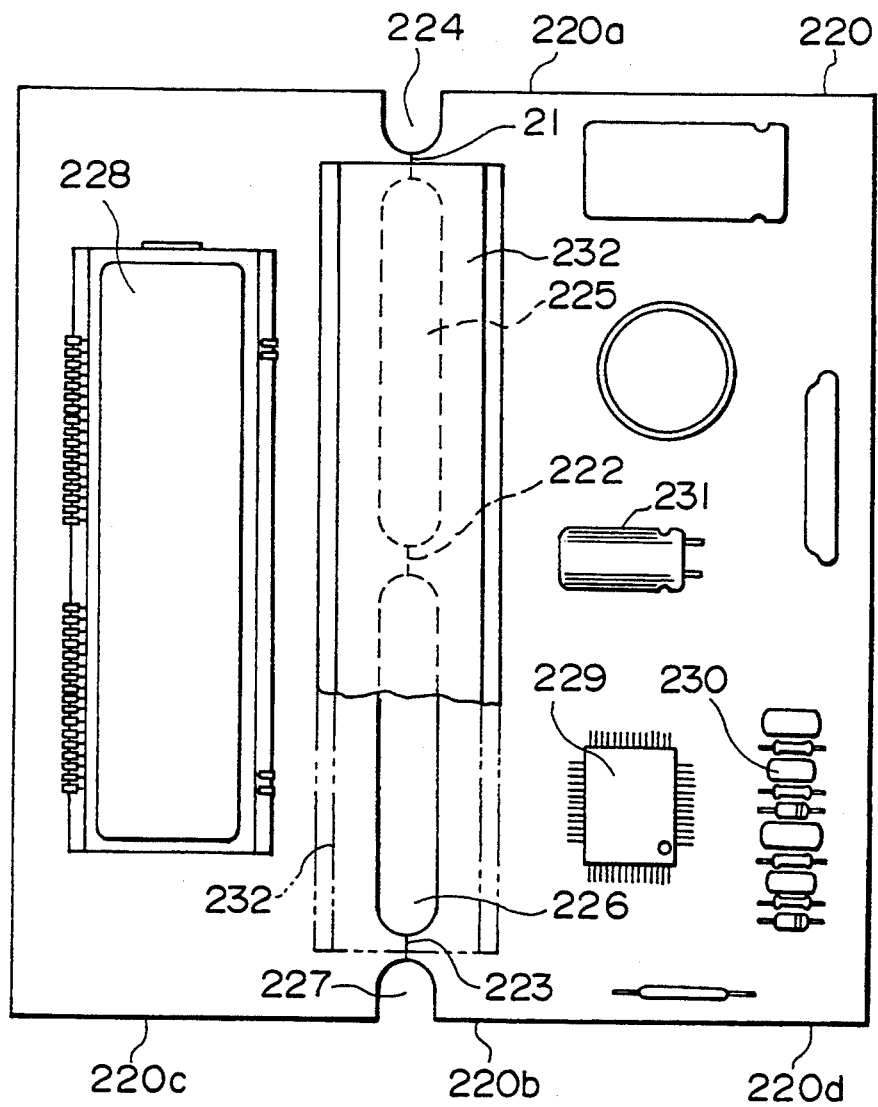
FIG. 18 is a plan view showing an embodiment of an electronic circuit unit according to the present invention, at a time when the embodiment is not yet separated into two parts.
Figure 19:
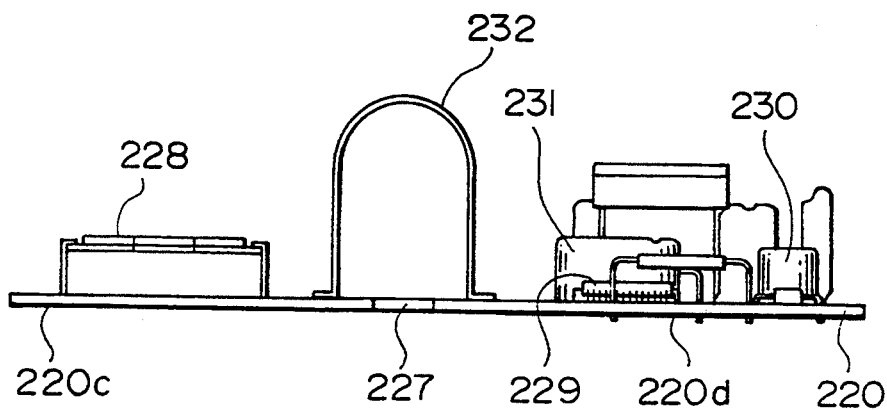
FIG. 19 is a side view showing the embodiment of FIG. 18 at a time when the embodiment is not yet separated into two parts.
Figure 20:
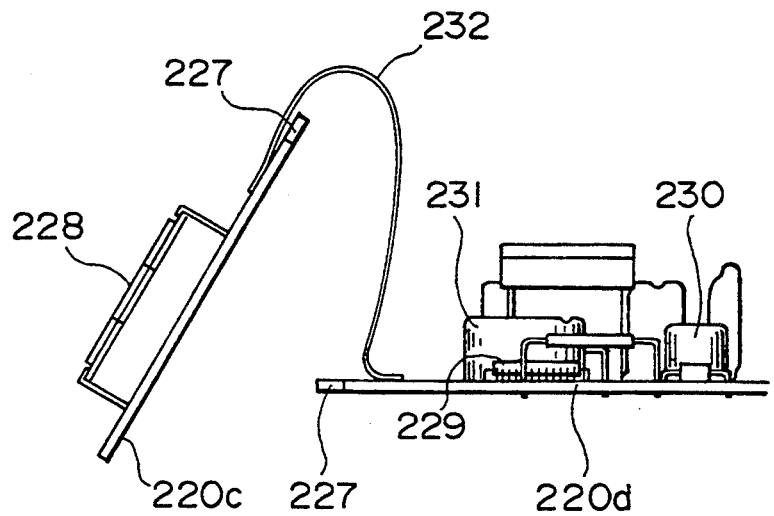
FIG. 20 is a side view showing the embodiment of FIG. 18 at a time when the embodiment has been separated into two parts.

FIGS. 18 to 20 show an embodiment of an electronic circuit unit according to the present invention. In more detail. FIGS. 18 and 19 show the present embodiment at a time when a printed wiring board is not yet separated into two parts, and FIG. 20 shows the present embodiment at a time when the printed wiring board has been separated into two parts.

Referring to FIGS. 18 and 19, apertures 224 to 227 are formed in a printed board 220 along a straight line traversing the board 220 so that one of small connecting portions 221 to 223 is left between adjacent apertures. Intermediate ones 225 and 226 of the apertures have the form of a long groove, and end apertures (namely, notches) 224 and 227 are formed at facing edges 220a and 220b of the board 220, respectively. Thus, the printed board 220 is divided into a left part 220c and a right part 220d, with the apertures 224 to 227 therebetween. A liquid crystal display portion 228 is mounted on the left part 220c, and a circuit part made up of an IC 229, a resistor 230, a capacitor 231 and others is mounted on the right part 220d. The parts 220c and 220d are electrically connected with each other by a connecting member such as a flexible printed board or flat cable 232.

FIG. 20 shows the present embodiment at a time when the printed board 220 has been separated into the parts 220c and 220d by bending the connecting portions 221 to 223.

Figure 21:
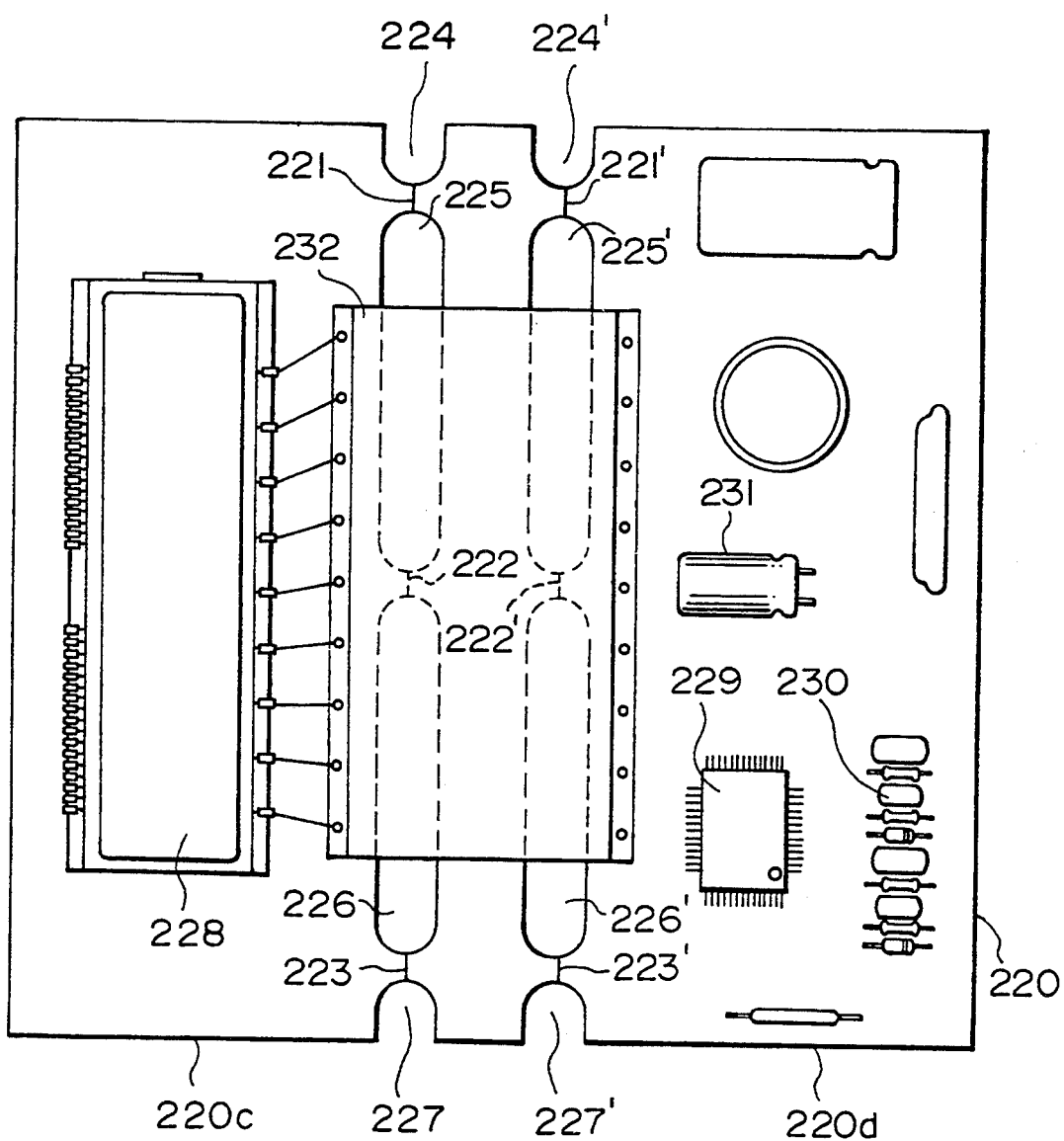
FIG. 21 is a plan view showing another embodiment of an electronic circuit unit according to the present invention, at a time when the embodiment is not yet separated into two parts.
Figure 22:
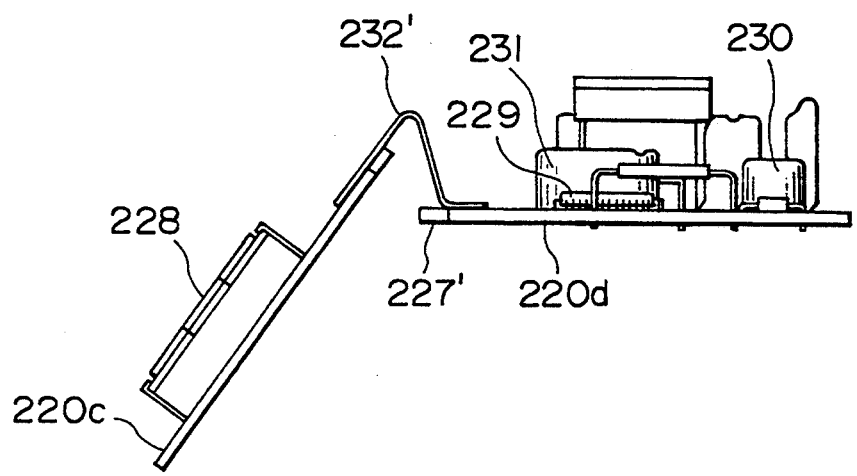
FIG. 22 is a side view showing the embodiment of FIG. 21 a time when the embodiment has been separated into two parts.

FIGS. 21 and 22 show another embodiment of an electronic circuit unit according to the present invention. The present embodiment is different from the embodiment of FIGS. 18 to 20 in that a combination of apertures and connecting portions is disposed in parallel with another combination of apertures and connecting portions, and a flat cable 232' does not have a curved form shown in FIG. 19, but is parallel to the upper surface of the wiring board 220. Thus, the flexible cable 232' can be readily bonded to the printed board 220 by solder. In the present embodiment, the wiring board 220 is bent at the above combinations, to be separated into the parts 220c and 220d, and the intermediate part sandwiched between the combinations is thrown away. It is to be noted that only a combination of connecting portions 221' to 223' and apertures 224' to 227' is added to the embodiment of FIGS. 18 to 20.

In the above embodiments of an inventive electronic circuit unit, a connecting member such as the flat cable is electrically connected with the parts 220c and 220d, before the printed board 220 is separated into the parts 220 and 220d. Accordingly, it is easy to connect the connecting member electrically with the parts 220c and 220d, and moreover the number of steps of connecting the connecting member to the parts 220c and 220d is reduced. Further, when the wiring board 220 is separated into the parts 220c and 220d, the liquid crystal display portion 228 can be oriented in various directions.

Figure 23A:
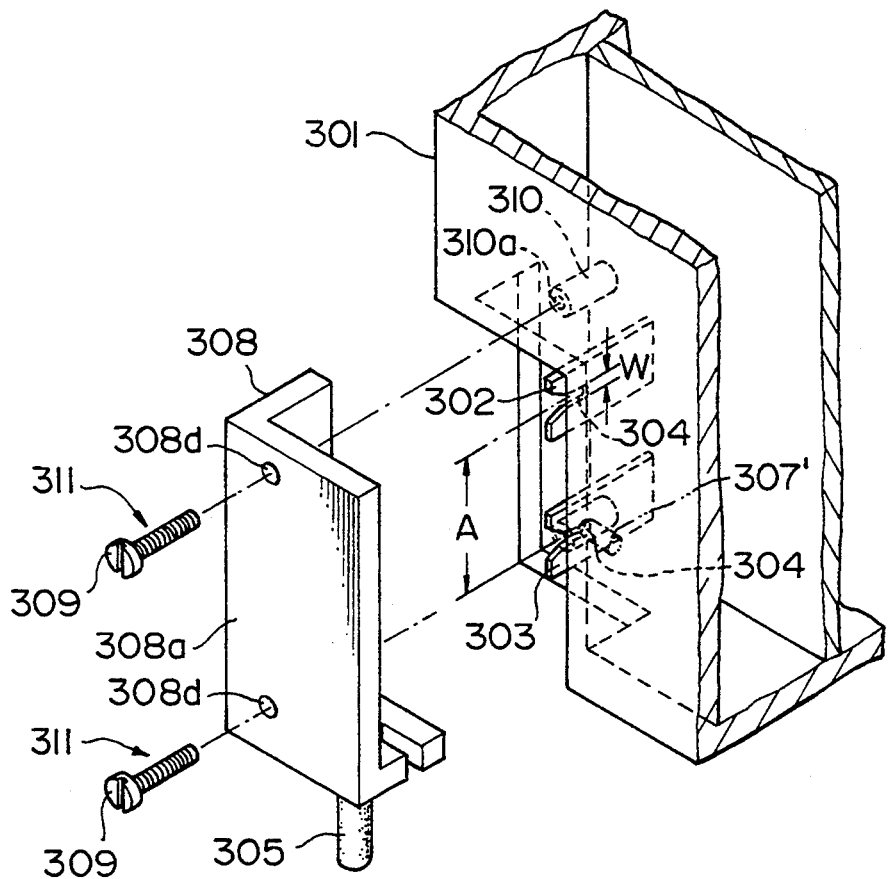
FIG. 23A is a perspective view showing an inventive combination of an electronic meter proper and a holding member for connecting lead wires of a cord to the electronic meter proper.
Figure 23B:
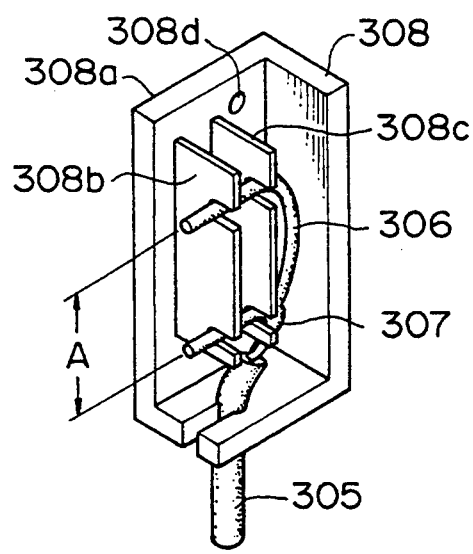
FIG. 23B is a perspective view showing the cord grasping mechanism of the holding member of FIG. 23A.

FIGS. 23A and 23B show an embodiment of a connecting structure for connecting lead wires of a cord to an electronic meter in accordance with the present invention.

Referring to FIGS. 23A and 23B, an electronic meter proper 301 is provided with a pair of terminals 302 and 303 which are electrically insulated from each other and have the same shape. Each of the terminals 302 and 303 is formed of a metal plate, and has a V-shaped notch 304 whose bottom is extended as a narrow aperture having a width w. The terminals 302 and 303 are disposed on the same vertical plane so that the notches 304 are directed toward the outside (that is, left side in FIG. 23A) and are spaced apart from each other a distance A. Incidentally, in the present embodiment, a gas meter is used as the electronic meter.

Figure 24:
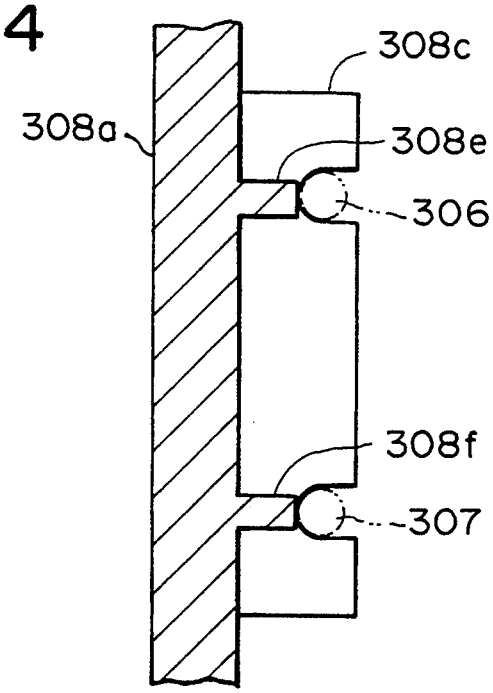
FIG. 24 is a side view showing a main part of the holding member of FIG. 23A.
Figure 25:
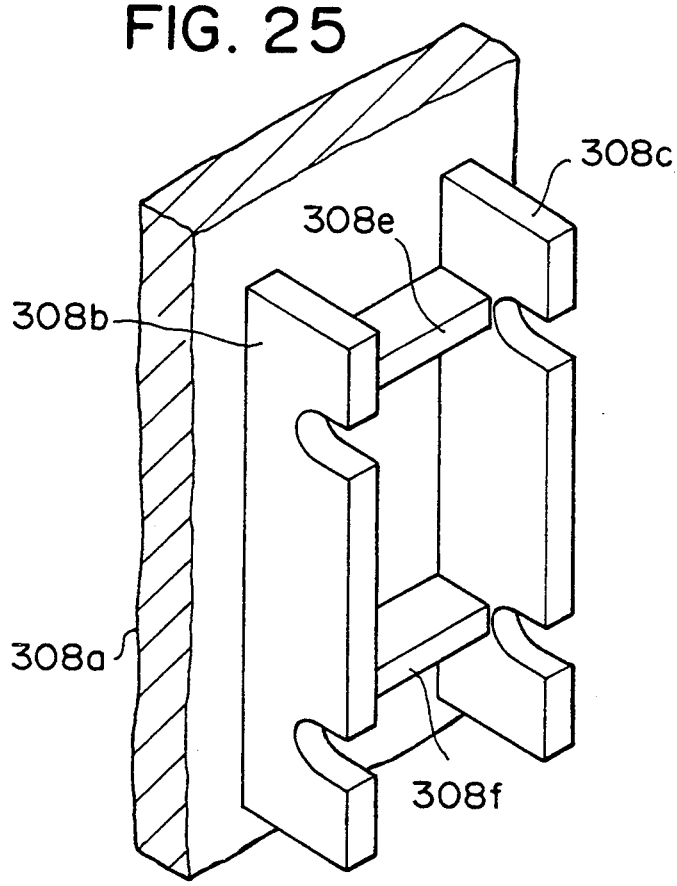
FIG. 25 is a perspective view showing a main part of the holding member of FIG. 23A.

Further, a cord 305 has two lead wires 306 and 307, each of which is formed of a conductor (that is, copper wire) coated with an insulating material. A holding member 308 is made of an insulating synthetic resin, and the push portion 308a of the holding synthetic resin, and the push portion 308a of the holding member 308 has the form of a plate. A pair of parallel protrusions are formed on the rear surface of the press portion 308a, and a plurality of notches are formed in each protrusion at an interval A so that each of the lead wires 306 and 307 (that is, upper wires coated with the insulating material) is grasped by a pair of notches in a stretched state. Hence, the above protrusions will hereinafter be referred to as "grasping portions 308b and 308c". The push portion 308a has two through holes 308d. A pair of screws 309 penetrate the through holes 308d, and are then threaded inside of female screws 310a provided in rods 310 which are fixed to the electronic meter proper 301. Referring now to FIGS. 24 and 25, a pair of protrusions 308e and 308f are formed on the rear surface of the push portion 308a so as to be sandwiched between the grasping portions 308b and 308c. As can be seen from FIGS. 24 and 25, the protrusions 308e and 308f prevent those portions of the lead wires 306 and 307 which are stretched between the grasping portions 308b and 308c, from approaching the push portion 308a, and assist in forcing the copper wires of the lead wires 306 and 307 in the notches 304 of the terminals 302 and 303 when the holding member 308 is mounted on the electronic meter proper 301.

When the lead wires 306 and 307 of the cord 305 are held by the notches of the grasping portions 308b and 308c so that the lead wires 306 and 307 are made parallel to each other with the distance A therebetween as shown in FIG. 23B, the holding member 308 is then brought near to the electronic meter proper 301 in a direction shown in FIG. 23A, and the screws 309 are threaded inside of the female screws 310a of the rods 310 through the holes 308d of the push portion 308a of the holding member 308, those parallel portions of the lead wires 306 and 307 which exist between the grasping portions 308b and 308c, confront the notches 304 of the terminals 302 and 303, respectively. Then, the screws 309 are tightened. Thus, the holding member 308 approaches the electronic meter proper 301, and the lead wires 306 and 307 are forced in narrow apertures of the notches 304 of the terminals 302 and 304. Hence, the insulating material of each lead wire is removed, and the copper wires of the lead wires 306 and 307 are pressed into close contact with the terminals 302 and 303, respectively. Incidentally, in FIG. 23A, a lead wire pressed in a close contact with the terminal 303 is designated by reference numeral 307' and indicated by two-dot dash lines.

It is to be noted that the width w of the narrow apertures of the notches 304 provided in the terminals 302 and 303 is made slightly smaller than the diameter of the copper wires of the lead wires 306 and 307.

In the present embodiment, a case where the core 305 has two lead wires and the electronic meter proper 301 is provided with two terminals, has been explained, by way of example. A connecting structure according to the present invention will produce a more marked effect in a case where a multiplicity of lead wires are connected to the same number of terminals of the electronic meter proper.

The present embodiment has the above-mentioned construction. Accordingly, a plurality of lead wires are connected to the electronic meter proper at the same time and in a short time. Moreover, the number of steps for connecting the lead wires to the electronic meter proper is reduced, and there is no fear of forgetting the connection of one or more lead wires to the electronic meter proper.

We claim:

1. A fluidic gas meter including a flow path structure provided with a fluidic element, a cut-off valve, a pressure switch, a flow sensor, a piezoelectric film sensor, an electronic circuit unit, and a wiring board serving as a mother board and having a function of lead wires, each of the cut-off valve, the pressure switch, the flow sensor and the piezoelectric film sensor being fixed to the flow path structure, the electronic circuit unit being made up of a counter board and a control circuit board, the counter board being mounted with an electronic circuit for counting up flow-rate signals from the flow sensor and the piezoelectric film sensor and a liquid crystal display device for displaying the amount of gas consumed, the control circuit board being mounted with a control circuit for controlling the cut-off valve, wherein each of the cut-off valve, the pressure switch, the flow sensor, the piezoelectric film sensor and the electronic circuit unit provided with a plurality of terminals extending perpendicularly to the wiring board, the wiring board being provided with a printed circuit for the interconnection among the terminals, said wiring board having a plurality of V-shaped guide grooves formed therein for receiving said terminals and guiding said terminals to through holes formed at an apex of the V-shape of the guide grooves, wherein said terminals form an electrical connection with the printed circuit of the circuit board, thereby avoiding wiring errors.

2. A fluidic gas meter according to claim 1, wherein said terminals are disposed horizontally or vertically in the same plane.

3. A fluidic gas meter according to claim 1, wherein the electronic circuit unit is disposed at a top of the flow path structure, and the flow sensor and the piezoelectric film sensor are disposed on an outlet side of the flow path structure in series.

4. A fluidic gas meter according to claim 1, wherein the electronic circuit unit is disposed at a middle of the flow path structure, and the flow sensor and the piezoelectric film sensor are disposed on an outlet side of the flow path structure in series.

5. A fluidic gas meter according to claim 1, wherein a guide hole is formed in a central portion of the wiring board, and the flow path structure is provided with a guide shaft fitted into the guide hole thereby facilitating the positioning of the wiring board during assembly of the gas meter.

6. A fluidic gas meter according to claim 1, wherein the wiring board includes an external terminal for transmitting a signal outside the gas meter.

7. A fluidic gas meter according to claim 2, wherein the electronic circuit unit is disposed at the top of the flow path structure, and the flow-sensor and the piezoelectric-film sensor are disposed on an outlet side of the flow path structure in series.

8. A fluidic gas meter according to claim 2, wherein the wiring board includes an external terminal for transmitting a signal outside the gas meter.

9. A fluidic gas meter according to claim 3, wherein the wiring board includes an external terminal for transmitting a signal outside the gas meter.

10. A fluidic gas meter according to claim 4, wherein the wiring board includes an external terminal for transmitting a signal outside the gas meter.

11. A fluidic gas meter, including a flow path structure provided with a fluidic element; a cut-off valve, a pressure switch, a flow sensor, a piezoelectric film sensor, an electronic circuit unit, and a wiring board serving as a mother board having the function of lead wires;
   each of the cut-off valve, the pressure switch, the flow sensor and the piezoelectric film sensor being fixed to the flow path structure;
   the electronic circuit unit being made up of a counter board and a control circuit board, the counter board being mounted with an electronic circuit for counting up flow-rate signals from the flow sensor and the piezoelectric-film sensor and with a liquid crystal display device for displaying the amount of gas consumed;

a control circuit for controlling the cut-off valve is mounted on the control circuit board, wherein each of the cut-off valve, the pressure switch, the flow sensor, the piezoelectric-film sensor and the electronic circuit unit are provided with a plurality of terminals extending perpendicularly to said wiring board; said wiring board being provided with a printed circuit for the interconnection among the terminals, said wiring board having a plurality of V-shaped guide grooves formed therein for receiving said terminals and guiding said terminals to through holes formed at an apex of the V-shape of the guide grooves, wherein said terminals form an electrical connection with the printed circuit of the circuit board, thereby avoiding wiring errors.

* * * * *